(12) United States Patent
Sridharan et al.

(10) Patent No.: US 11,854,922 B2
(45) Date of Patent: Dec. 26, 2023

(54) SEMICONDUTOR PACKAGE SUBSTRATE WITH DIE CAVITY AND REDISTRIBUTION LAYER

(71) Applicant: TEXAS INSTRUMENTS INCORPORATED, Dallas, TX (US)

(72) Inventors: Vivek Swaminathan Sridharan, Dallas, TX (US); Christopher Daniel Manack, Flower Mound, TX (US); Joseph Liu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 14 days.

(21) Appl. No.: 17/353,805

(22) Filed: Jun. 21, 2021

(65) Prior Publication Data

US 2022/0406673 A1 Dec. 22, 2022

(51) Int. Cl.
*H01L 23/31* (2006.01)
*H01L 23/00* (2006.01)

(52) U.S. Cl.
CPC .......... *H01L 23/3121* (2013.01); *H01L 24/19* (2013.01); *H01L 24/20* (2013.01); *H01L 24/24* (2013.01); *H01L 24/73* (2013.01); *H01L 24/92* (2013.01); *H01L 24/97* (2013.01); *H01L 24/02* (2013.01); *H01L 24/16* (2013.01); *H01L 24/32* (2013.01); *H01L 2224/0233* (2013.01); *H01L 2224/16227* (2013.01); *H01L 2224/19* (2013.01); *H01L 2224/221* (2013.01); *H01L 2224/244* (2013.01); *H01L 2224/24137* (2013.01); *H01L 2224/24155* (2013.01); *H01L 2224/32137* (2013.01); *H01L 2224/32155* (2013.01); *H01L 2224/32225* (2013.01); *H01L 2224/73204* (2013.01); *H01L 2224/73209* (2013.01); *H01L 2224/73217* (2013.01); *H01L 2224/73267* (2013.01); *H01L 2224/9211* (2013.01); *H01L 2224/92125* (2013.01); *H01L 2224/92135* (2013.01);
(Continued)

(58) Field of Classification Search
CPC ........ H01L 24/19; H01L 24/20; H01L 24/24; H01L 24/73; H01L 24/92; H01L 24/97
USPC ......................................................... 257/737
See application file for complete search history.

(56) References Cited

U.S. PATENT DOCUMENTS 5,198,385 A 3/1993 Devitt et al.
6,518,089 B2 2/2003 Coyle
(Continued)

OTHER PUBLICATIONS

Tang et al., Multi-Layer Semiconductor Package With Stacked Passive Components, Texas Instruments Docket No. TI-90982, U.S. Appl. No. 16/941,818, filed Jul. 29, 2020.

*Primary Examiner* — Jasmine J Clark
(74) *Attorney, Agent, or Firm* — Dawn Jos; Frank D. Cimino (57) ABSTRACT

A semiconductor package includes a semiconductor substrate forming a cavity and a redistribution layer on a first side of the semiconductor substrate, the redistribution layer forming die contacts within the cavity and a set of terminals for the semiconductor package opposite the semiconductor substrate. The redistribution layer electrically connects one or more of the die contacts to the set of terminals. The semiconductor package further includes a semiconductor die including die terminals within the cavity with the die terminals electrically coupled to the die contacts within the cavity.

24 Claims, 10 Drawing Sheets

(52) U.S. Cl.
CPC ............ *H01L 2924/19041* (2013.01); *H01L 2924/19042* (2013.01); *H01L 2924/19043* (2013.01); *H01L 2924/19104* (2013.01)

(56) References Cited

U.S. PATENT DOCUMENTS

| | | |
|---|---|---|
| 6,798,047 B1 | 9/2004 | Miks et al. |
| 7,582,963 B2 | 9/2009 | Gerber et al. |
| 8,269,348 B2 | 9/2012 | Fazelpour |
| 8,536,695 B2 | 9/2013 | Liu et al. |
| 9,663,357 B2 | 5/2017 | Mao et al. |
| 10,104,764 B2 | 10/2018 | Stepniak et al. |
| 10,541,220 B1 | 1/2020 | Komatsu et al. |
| 2013/0082407 A1 | 4/2013 | Abbott et al. |
| 2013/0299974 A1* | 11/2013 | Chi ................... H01L 24/81 257/737 |
| 2015/0061103 A1 | 3/2015 | Manack et al. |
| 2016/0282212 A1* | 9/2016 | Beer .................. H01L 21/56 |
| 2019/0013288 A1 | 1/2019 | Kim et al. |
| 2020/0118949 A1 | 4/2020 | Moallem et al. |
| 2020/0258825 A1 | 8/2020 | Tang et al. |
| 2022/0051972 A1* | 2/2022 | Kim ............... H01L 23/49838 |

\* cited by examiner

SEMICONDUTOR PACKAGE SUBSTRATE WITH DIE CAVITY AND REDISTRIBUTION LAYER

TECHNICAL FIELD

This disclosure relates to semiconductor packages.

BACKGROUND

Semiconductor packages provide support a semiconductor die and associated bond wires, provide protection from the environment, and enable surface-mounting of the die to and interconnection with a board, such as a printed circuit board (PCB). Electronic package technology continues trends towards miniaturization, integration, and speed. These same trends have forced the development of semiconductor packages having smaller footprints, higher lead counts, and better electrical and thermal performance.

Wafer chip scale packages (WCSP) eliminates conventional packaging steps such as die bonding, wire bonding, and die level flip chip attach processes to a package substrate by using the semiconductor die itself as the WCSP substrate. Use of a semiconductor die itself as the WCSP substrate significantly reduces the footprint to the semiconductor die itself as compared to the same semiconductor die attached to a larger footprint package substrate. However, as semiconductor die processes facilitate semiconductor dies with smaller and smaller footprints, size and spacing requirements for package terminals to facilitate a reliable connections with a board limit reductions in WCSP sizes as a practical matter.

Fan-out packages include a redistribution layer to provide an electrical connections between a package terminals with desired size and spacing and a smaller array of die terminals. In one example of a fan-out package, an array of semiconductor dies are individually mounted to a carrier by a pick-and-place method and covered with a dielectric mold compound. The molded array of semiconductor dies are removed from the carrier. A redistribution layer including package terminals is added over the array of semiconductor dies providing electrical connections between the die terminals and package terminals. The molded semiconductor dies with the redistribution layer are singulated to form a plurality of singulated semiconductor packages, each package including its own redistribution layer with a set of package terminals. Such fan-out packages take advantage of semiconductor die processes providing smaller footprints while providing package terminals with size and spacing sufficient to facilitate a reliable connections with a board.

BRIEF SUMMARY

Packages disclosed herein include a semiconductor die within a cavity of a substrate, such as a semiconductor substrate. The substrate includes cavity with a redistribution layer forming die contacts within the cavity and a set of terminals for the semiconductor package opposite the substrate.

Fan-out packages disclosed herein may be manufactured without the need for a carrier. The inventors have identified the pick-and-place process for positioning semiconductor dies on a carrier as a high-cost bottleneck in the manufacture of fan-out packages. By forming a redistribution layer on a dummy wafer prior to placing the semiconductor dies within cavities of the wafer, the pick-and-place and molding processes may be performed independently of forming redistribution layer. The disclosed processes and resulting semiconductor packages free the manufacturing facilities used to form the redistribution layer for other processes while the semiconductor dies are positioned within the substrate cavities and molded.

In one example, a semiconductor package including a semiconductor substrate forming a cavity and a redistribution layer on a first side of the semiconductor substrate, the redistribution layer forming die contacts within the cavity and a set of terminals for the semiconductor package opposite the semiconductor substrate. The redistribution layer electrically connects one or more of the die contacts to the set of terminals. The semiconductor package further includes a semiconductor die including die terminals within the cavity with the die terminals electrically coupled to the die contacts within the cavity.

In a further example, a method of forming a package includes forming a redistribution layer on a first side of a semiconductor substrate, the redistribution layer including die contacts adjacent the first side of the semiconductor substrate and a set of terminals for the semiconductor package opposite the semiconductor substrate, forming a cavity in the semiconductor substrate adjacent to the die contacts, placing a semiconductor die including die terminals within the cavity with the die terminals facing the redistribution layer, and electrically coupling the die terminals to the die contacts of the redistribution layer within the cavity.

DETAILED DESCRIPTION

Figure 1A:
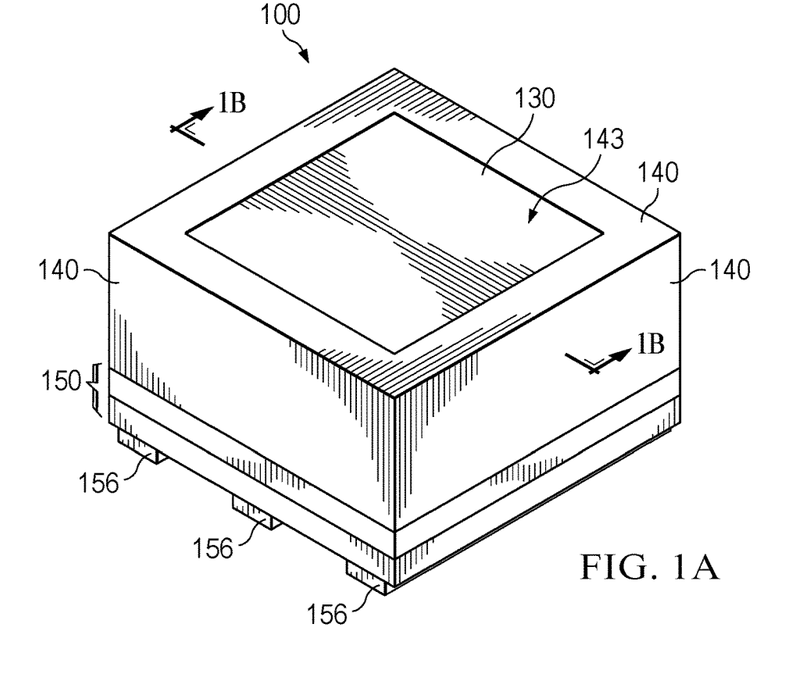
FIGS. 1A-1B illustrate a semiconductor package including a semiconductor substrate with an embedded semiconductor die.
Figure 1B:
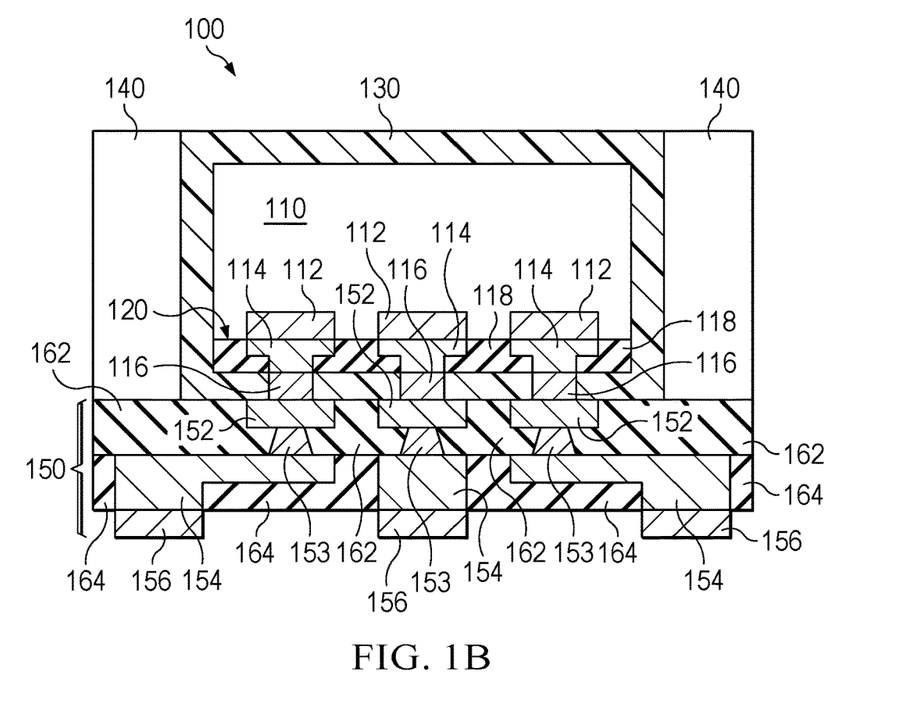

FIGS. 1A and 1B illustrate semiconductor package 100. Specifically, FIG. 1A illustrates a perspective view of semiconductor package 100, and FIG. 1B illustrates a cross-sectional view of semiconductor package 100. Semiconductor package 100 includes a semiconductor substrate 140 forming a cavity 143 with a semiconductor die 110 embedded in cavity 143. Semiconductor package 100 further includes a redistribution layer 150 that electrically connects die pads 112 of semiconductor die 110 to package terminals 156. Semiconductor package 100 is a fan-out package as the array of package terminals 156 extend beyond the array of die pads 112.

Semiconductor substrate 140 serves as a substrate for the formation of redistribution layer 150. In some examples, semiconductor substrate 140 is formed from a dummy wafer, such as a silicon wafer, germanium wafer, gallium arsenide wafer, or other semiconductor wafer. In this manner, semiconductor substrate 140 may be free of circuit elements such as transistors, diodes, capacitors, and resistors.

In some examples, semiconductor substrate 140 is a silicon substrate including crystalline silicon (in any crystal plane orientation), amorphous silicon, doped silicon (p or n type), undoped silicon, and/or reclaimed silicon. Using semiconductor substrates allows semiconductor substrate 140 to be produced with manufacturing processes and equipment for semiconductor wafers. In other examples, substrates other than semiconductors are also contemplated including, but not limited to glass substrates and copper substrates.

In examples in which semiconductor substrate 140 is replaced with a glass substrate, the glass substrate may be a glass wafer. Example glass materials suitable for the glass substrate include, but are not limited to, fused silica, quartz, single crystal quartz, borosilicate glass, soda lime glass, barium borosilicate glass, crown glass, boro-aluminosilicate glass, and indium tin oxide glass. All other aspects of semiconductor package 100 are substantially similar when semiconductor substrate 140 is replaced with a glass substrate.

Redistribution layer 150 is on a first side of semiconductor substrate 140. Redistribution layer 150 forms die contacts 152 within cavity 143 and a set of terminals 156 for semiconductor package 100 opposite semiconductor substrate 140. Redistribution layer 150 includes a first dielectric layer 162 over die contacts 152. A redistribution layer trace 154 is over the first dielectric layer 162 with vias 153 that physically and electrically connect to the die contacts 152. A second dielectric layer 164 is over redistribution layer trace 154 with terminals 156 being exposed in gaps in the second dielectric layer 164. The first and second dielectric layers 162, 164 may include dielectrics such as polyimides or benzocyclobutene (BCB). Redistribution layer trace 154 includes individual conductive traces that electrically connect die contacts 152 to terminals 156. Terminals 156 may include under bump metallization (UBM) pads commonly referred to as "ball pads" or "bump pads" over a base metal layer of redistribution layer trace 154. In some examples, package 100 may further include metal bonding connectors (not shown), such as solder balls, pillars (e.g., copper pillars) or studs (e.g., Au Studs) over terminals 156. In various examples, redistribution layer 150 may include any number of conductive and dielectric layers providing connections between die contacts 152 and package terminals 156.

Semiconductor die 110 comprises a substrate (e.g., silicon or silicon/germanium) having an active surface and an inactive surface. Bond pads 112 are exposed in bond pad openings in a dielectric layer of semiconductor die 110 on its active surface. Die pads 112 are bonded to a metallization layer including functional circuitry (not shown) in a semiconductor substrate. The functional circuitry of semiconductor die 110 is formed on a semiconductor wafer prior to singulation of semiconductor die 110 and includes circuit elements such as transistors, diodes, capacitors, and resistors, as well as signal lines and other electrical conductors that interconnect the various circuit elements. As nonlimiting examples, such functional circuitry may include an application specific integrated circuit (ASIC), a digital signal processor, a radio frequency chip, a memory, a microcontroller and a system-on-a-chip or a combination thereof. The functional circuitry is generally integrated circuitry that realizes and carries out desired functionality of the package, such as that of a digital IC (e.g., digital signal processor) or analog IC (e.g., amplifier or power converter), such as a BiMOS IC. The capability of functional circuitry may vary, ranging from a simple device to a complex device.

Semiconductor die 110 includes die pads 112 within cavity 143 with an active surface of semiconductor die 110 facing redistribution layer 150. In the specific example of semiconductor package 100, semiconductor die 110 includes a die scale redistribution layer 120 over its active surface, which includes die pads 112. Die scale redistribution layer 120 electrically couples die pads 112 to the die contacts 152 within cavity 143. Die scale redistribution layer 120 includes redistribution layer trace 114 with capture pads in contact with die pads 112, and a dielectric layer 118 over redistribution layer trace 114. Dielectric layer 118 may include dielectrics such as polyimides or BCB. In various examples, die scale redistribution layer 120 may include any number of conductive and dielectric layers providing connections between die pads 112 and die contacts 152 of redistribution layer 150. In yet other examples, die pads 112 may directly contact to die contacts 152.

Solder connections 116 electrically couple die pads 112 to die contacts 152 within cavity 143. Solder connections 116 are in electrical contact with the redistribution layer trace 114 through openings in the dielectric layer 118. In some examples, solder connections 116 represent reflowed solder bumps. Redistribution layer trace 114 may include UBM pads adjacent to solder connections 116.

Mold compound 130 surrounds semiconductor die 110 within cavity 143. In example of semiconductor package 100, semiconductor die 110 is recessed within cavity 143 such that is it covered by mold compound 130. In other examples, an inactive surface of semiconductor die 110 may be exposed on an external surface of the package, which may facilitate improved cooling of semiconductor die 110.

Mold compound 130 provides a protective layer covering semiconductor die 110 within cavity 143. Mold compound 130 may be formed from a nonconductive plastic or resin material. Mold compounds suitable for use as mold compound 130 include, for example, thermoset compounds that include an epoxy novolac resin or similar material combined with a filler, such as alumina, and other materials to make the compound suitable for molding, such as accelerators, curing agents, filters, and mold release agents. A maximum diameter of fillers of mold compound 130, if any, should be small enough to allow flow within the gap between semiconductor die 110 and semiconductor substrate 140.

The configuration of semiconductor package 100 facilitates manufacturing processes that overcome the pick-and-place bottleneck of prior fan-out package designs. For example, manufacturing processes for fan-out packages including a semiconductor die in a molded substrate can include pick-and-placing an array of semiconductor dies on a common carrier, molding the array of semiconductor dies, removing the molded array of semiconductor dies from the carrier, and then forming a redistribution layer over the molded array of semiconductor dies. In such a process, the pick-and-place process for positioning semiconductor dies on a carrier takes much longer than the processes required to form the redistribution layer—a high-cost bottleneck in the manufacture of fan-out packages. Due to the high cost of carriers and degradation over time of adhesive used to attach semiconductor dies to the carrier, pick-and-placing semiconductor dies on a batch of carriers is undesirable. In this manner, manufacturing facilities used to form the redistribution layer are only partially utilized during such manufacturing process.

In comparison, subassemblies including semiconductor substrate 140 and redistribution layer 150 can be batch manufactured in advance of pick-and-place processes to locate semiconductor die 110 within cavity 143 followed by molding with mold compound 130. In such an example manufacturing processes, facilities used to form redistribution layer 150 may be reallocated for other uses during later the pick-and-place processes to locate semiconductor die 110 within cavity 143, improving the utilization of manufacturing facilities and thereby reducing the costs of package 100 compared to fan-out packages including a semiconductor die in a molded substrate.

FIGS. 2A-2J illustrate cross-sectional views of conceptual process steps for manufacturing semiconductor package 100. The cross-sectional views of FIGS. 2A-2J are from the same perspective as FIG. 1B. The FIG. 3 is flowchart of a method of manufacturing a semiconductor package including a semiconductor substrate with an embedded semiconductor die. For clarity, the techniques of FIG. 3 are described with respect to semiconductor package 100 and FIGS. 2A-2J; however, the described techniques may also be readily adapted to alternative package configurations, including package 300, as described with respect to FIG. 4.

Figure 2A:
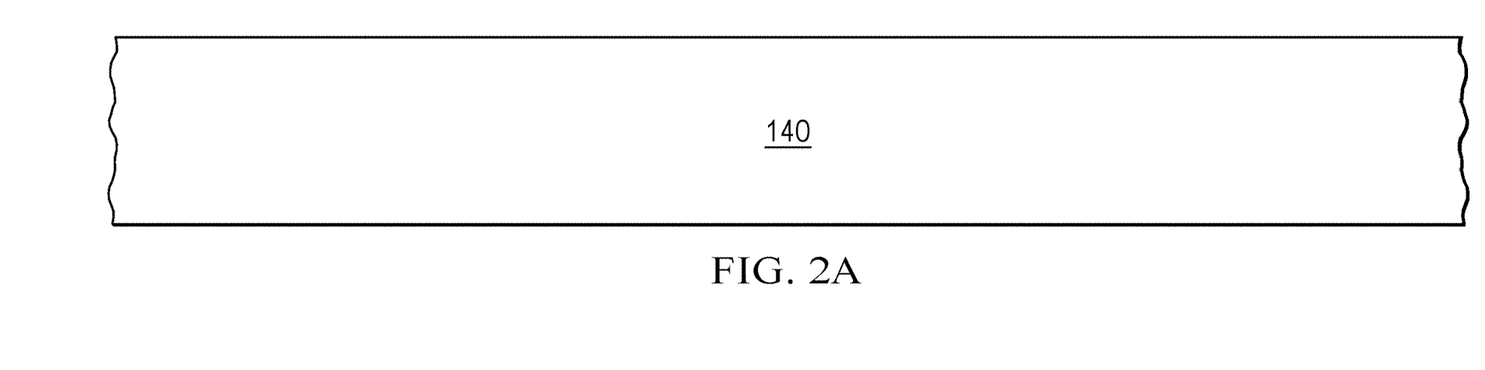
FIGS. 2A-2J illustrate conceptual process steps for manufacturing the package of FIGS. 1A and 1B.

FIG. 2A illustrates a blank semiconductor substrate 140. Semiconductor substrate 140 may be formed from any suitable semiconductor, such as silicon or silicon/germanium. Semiconductor substrate 140 may be a "dummy" substrate in that it is free of circuit elements such as transistors, diodes, capacitors, and resistors. In other examples, a semiconductor substrate may include circuit elements such as transistors, diodes, capacitors, resistors and electrical traces connecting the same. While FIGS. 2A-2J illustrate conceptual manufacturing packages processes for three adjacent packages 100, semiconductor substrate 140 is large enough for an array of packages 100, and may conform to a standard semiconductor wafer diameter, such as 150 millimeters (mm), 200 mm, 300 mm, or 450 mm. Likewise, the thickness of semiconductor substrate 140 may also conform to a thickness of a standard semiconductor wafer diameter, such as within a range of 300 micrometers (μall) to 1000 μm. In various examples, semiconductor packages 100 may have sizes of 3 mm×3 mm to 8 mm×8 mm, meaning a single wafer of semiconductor substrate 140 may serve as the substrate for an array including hundreds or even thousands of semiconductor packages 100.

Figure 2B:
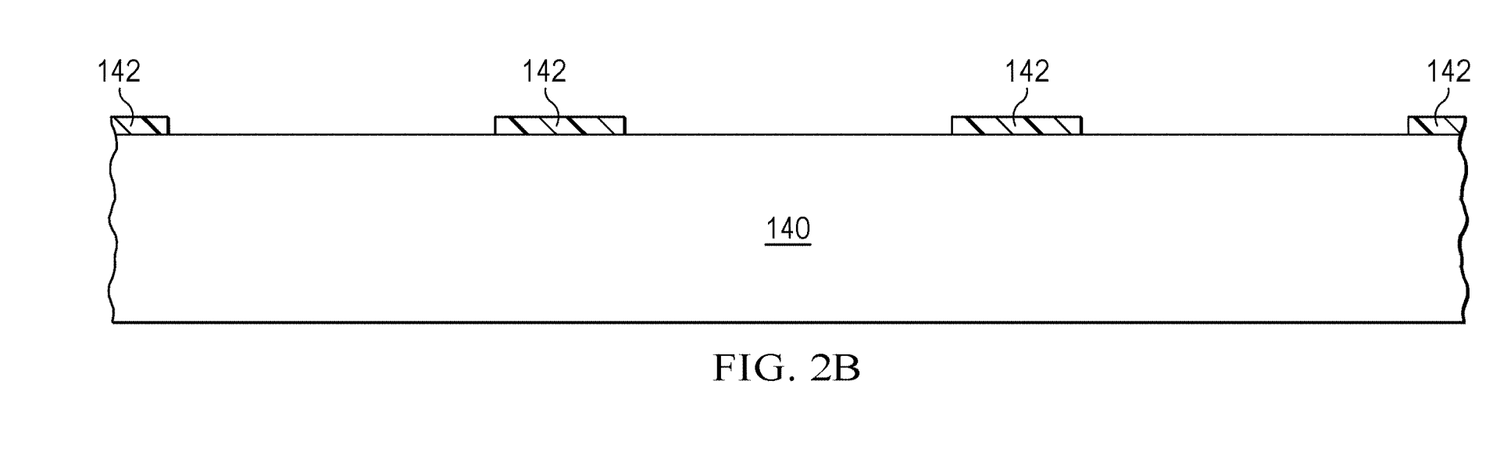

As represented by FIG. 2B, a mask 142 is printed on a backside of semiconductor substrate 140. Mask 142 protects semiconductor substrate 140 from a later etching process used to form cavities 143 as described with respect to FIG. 2G. In some examples, mask 142 includes a thermal oxide layer. The thickness of the thermal oxide layer should be thick enough to protect semiconductor substrate 140 during the etching process, but thin enough to support vacuum chucking/end effector handling. In some examples, the thermal oxide layer thickness may be about 500 Angstrom (A). Depending on etching techniques for cavities 143, mask 142 may include other suitable masking materials, such as silicon dioxide and/or silicon nitride.

Figure 2C:
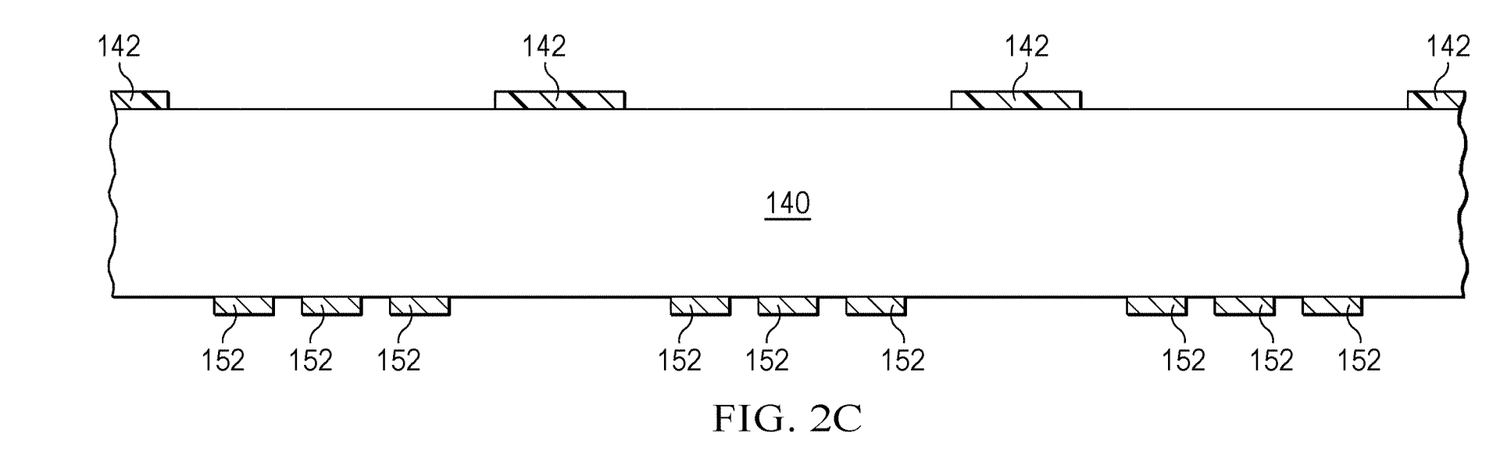
Figure 2D:
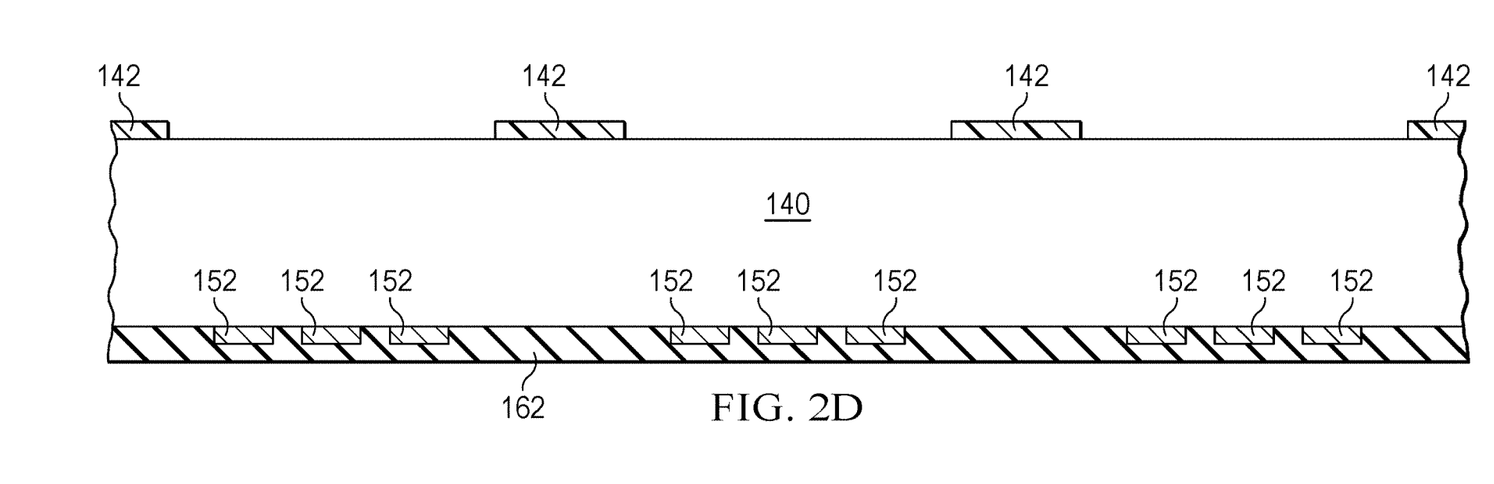
Figure 2E:
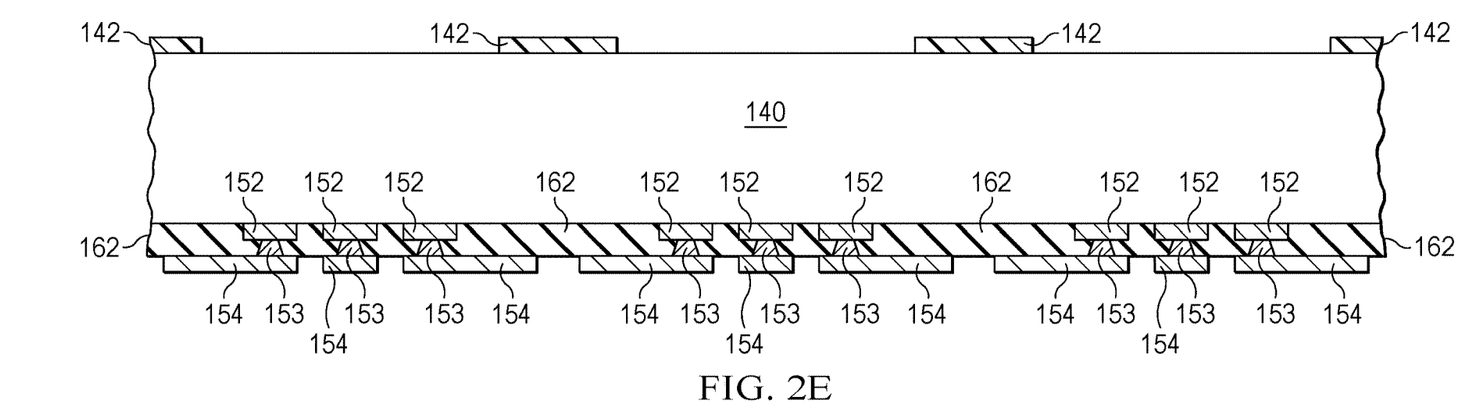
Figure 2F:
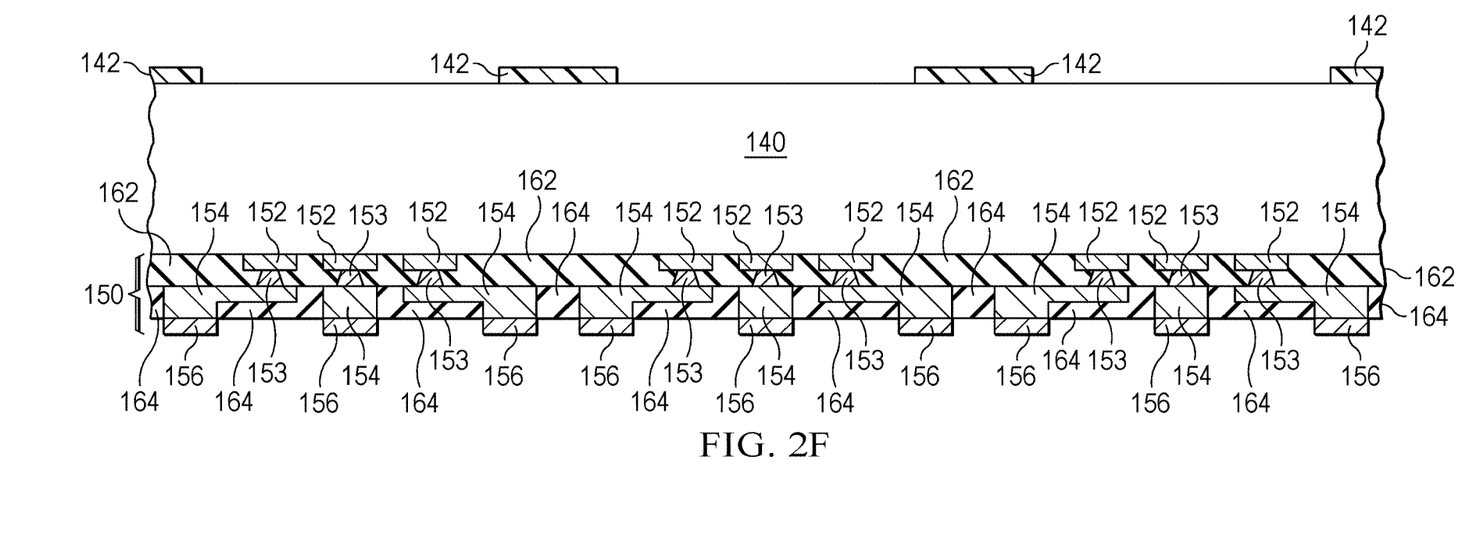

As represented by FIGS. 2C-2F, redistribution layer 150 is formed on semiconductor substrate 140 opposite mask 142 (FIG. 3, step 202). As represented by FIG. 2C, die contacts 152 are formed directly on semiconductor substrate 140 without an intervening dielectric layer like polyimide or BCB. For example, forming die contacts 152 may include metal deposition and patterning. As represented by FIG. 2D, dielectric layer 162 is formed over die contacts 152. As represented by FIG. 2E, lithography/etch forms vias 153 in dielectric layer 162 and redistribution layer trace 154 is pattered over dielectric layer 162, filling vias 153 with metal. As represented by FIG. 2F, dielectric layer 164 is formed over redistribution layer trace 154. Vias are formed in dielectric layer 164, and terminals 156 are plated or deposited within the vias. In some examples, package 100 may further include metal bonding connectors, such as solder balls over terminals 156. In such examples, terminals 156 may include UMB pads.

Figure 2G:
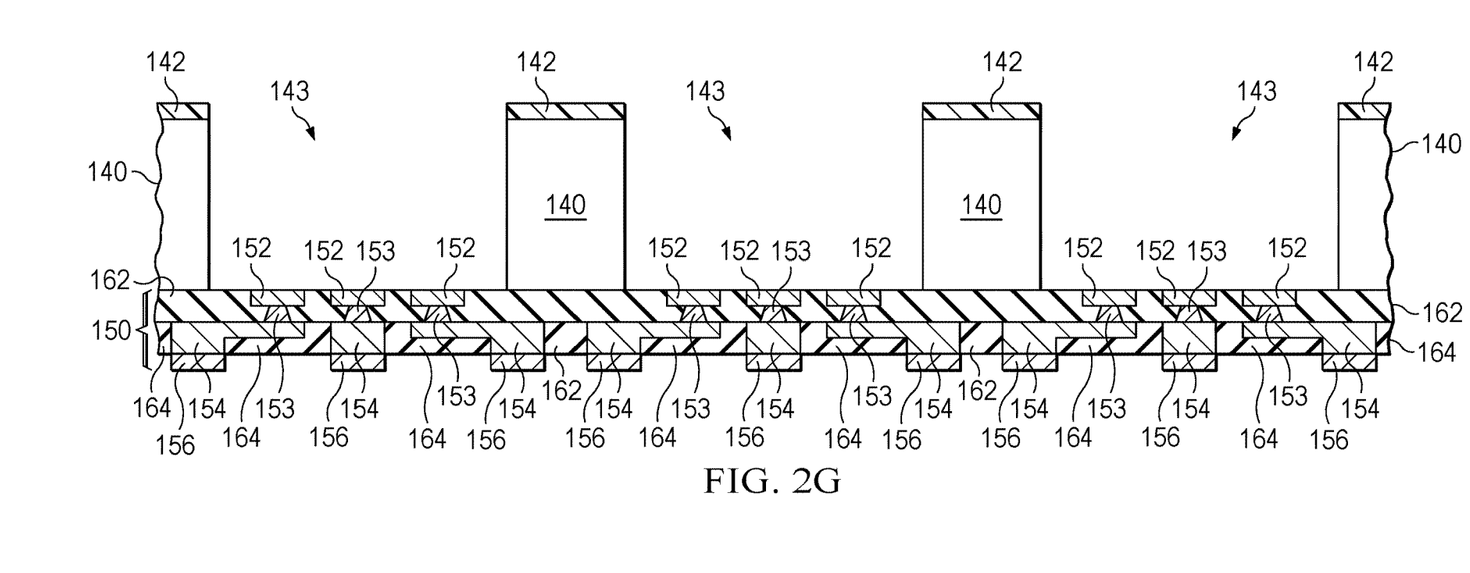
Figure 3:
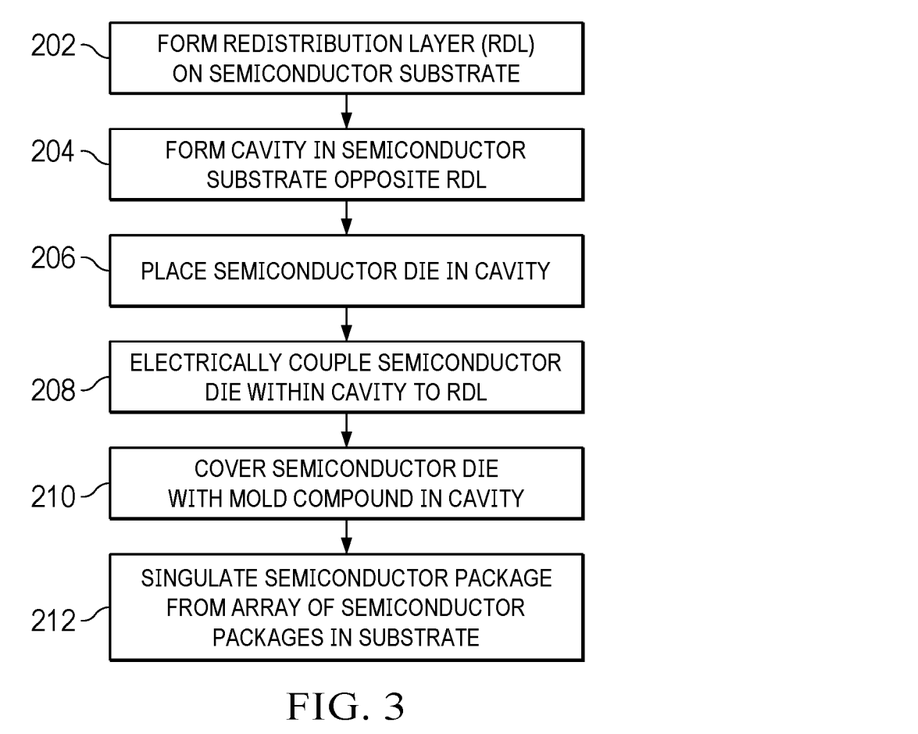
FIG. 3 is flowchart of a method of manufacturing a semiconductor package including a semiconductor substrate with an embedded semiconductor die, such as the package of FIGS. 1A and 1B.

As represented by FIG. 2G, following the formation of redistribution layer 150, cavities 143 are formed in semiconductor substrate 140 opposite redistribution layer 150 by etching semiconductor substrate 140 to expose die contacts 152 (FIG. 3, step 204). Etching techniques may include chemical etching or plasma-etching for both semiconductor substrate 140 and glass substrates. Laser drilling may also be used instead of etching.

Mask 142 defines the areas of semiconductor substrate 140 forming cavities 143. In some example, cavities 143 may be generally sized to receive semiconductor dies 110 with clearance for mold compound 130. For example, cavities 143 may be in the range of 200 μm to 10,000 μm, with clearance for mold compound 130 between the sidewalls of cavities 143 and semiconductor dies 110 of 10 μm to 500 μm.

Figure 2H:
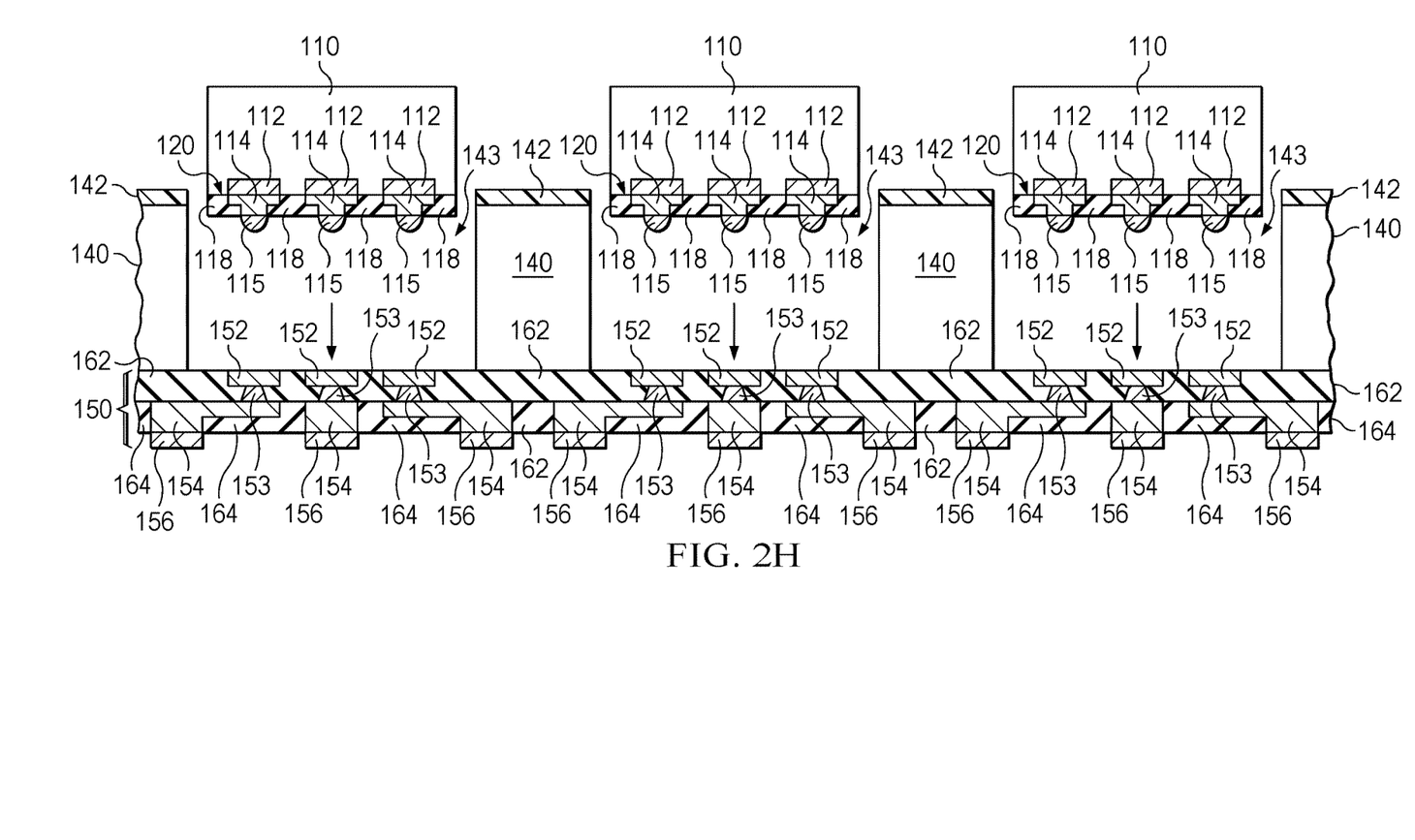

As represented by FIG. 2H, semiconductor dies 110, including die scale redistribution layers 120, are placed within cavities 143 (FIG. 3, step 206). Die pads 112 face the redistribution layer 150. Semiconductor dies 110 represent "bumped" dies in that they include die scale redistribution layer 120 over die pads 112 with redistribution layer trace 114 connecting die pads 112 to solder balls 115. Solder balls 115 are placed in contact with die contacts 152 of redistribution layer 150.

Pads 112 are electrically coupled to die contacts 152 of redistribution layer 150 within cavities 143 by reflowing solder balls 115 (FIG. 3, step 208). Either prior to or after the solder reflow, a dielectric underfill (not shown) may be used to fill the spaces between semiconductor dies 110 and redistribution layer 150 within cavities 143.

Figure 2I:
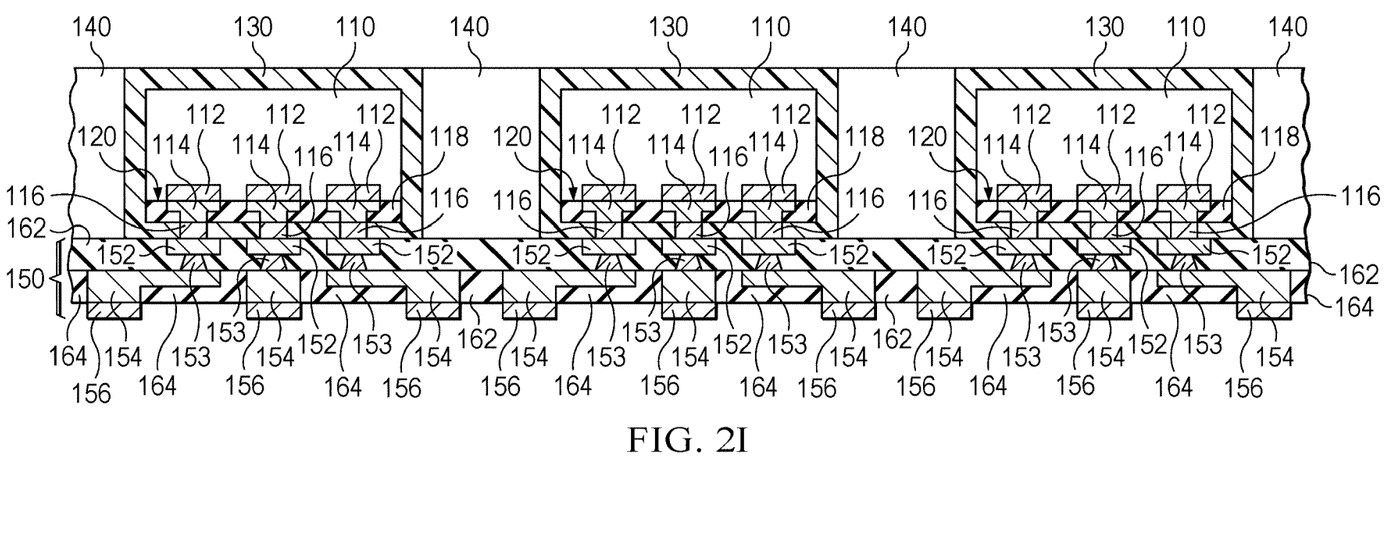

As represented by FIG. 2I, the partially assembled device of FIG. 2H is molded, thereby covering semiconductor dies 110 within cavities 143 with mold compound 130 (FIG. 3, step 210). For example, a transfer molding process may be used to cover semiconductor dies 110 with mold compound 130. Excess mold compound (not shown) may be removed from the assembly following the molding, for example by back-grinding semiconductor substrate 140.

In some examples, mold compound 130 may be applied as a viscous polymeric precursor dispensed within cavity 143 adjacent to semiconductor die 110 and be pulled into the gap between semiconductor die 110 and semiconductor substrate 140 by capillary forces. In other examples, mold compound 130 may be applied to either semiconductor die 110 or cavity 143 before semiconductor die 110 is mounted within cavity 143.

The viscous polymeric precursor is cured to form a solid dielectric barrier of mold compound 130 between semiconductor die 110 and semiconductor substrate 140. In some examples, the precursor may be heated, polymerized and "cured" to form the solid dielectric barrier. In such examples, mold compound 130 may include a resin such as an epoxy-based thermoset polymer. The resin of mold compound 130 may be filled or unfilled and include one or more of the following: resin, hardener, curing agent, fused silica, inorganic fillers, catalyst, flame retardants, stress modifiers, adhesion promoters, and other suitable components. Fillers, if any, may be selected to modify properties and characteristics of the resin base materials. Inert inorganic fillers may be selected for a lower coefficient of thermal expansion, increase thermal conductivity, and/or increase elastic modulus of the mold compound compared to the resin base. Particulate fillers may be selected to reduce strength characteristics such as tensile strength and flexural strength compared to the resin base materials.

Figure 2J:
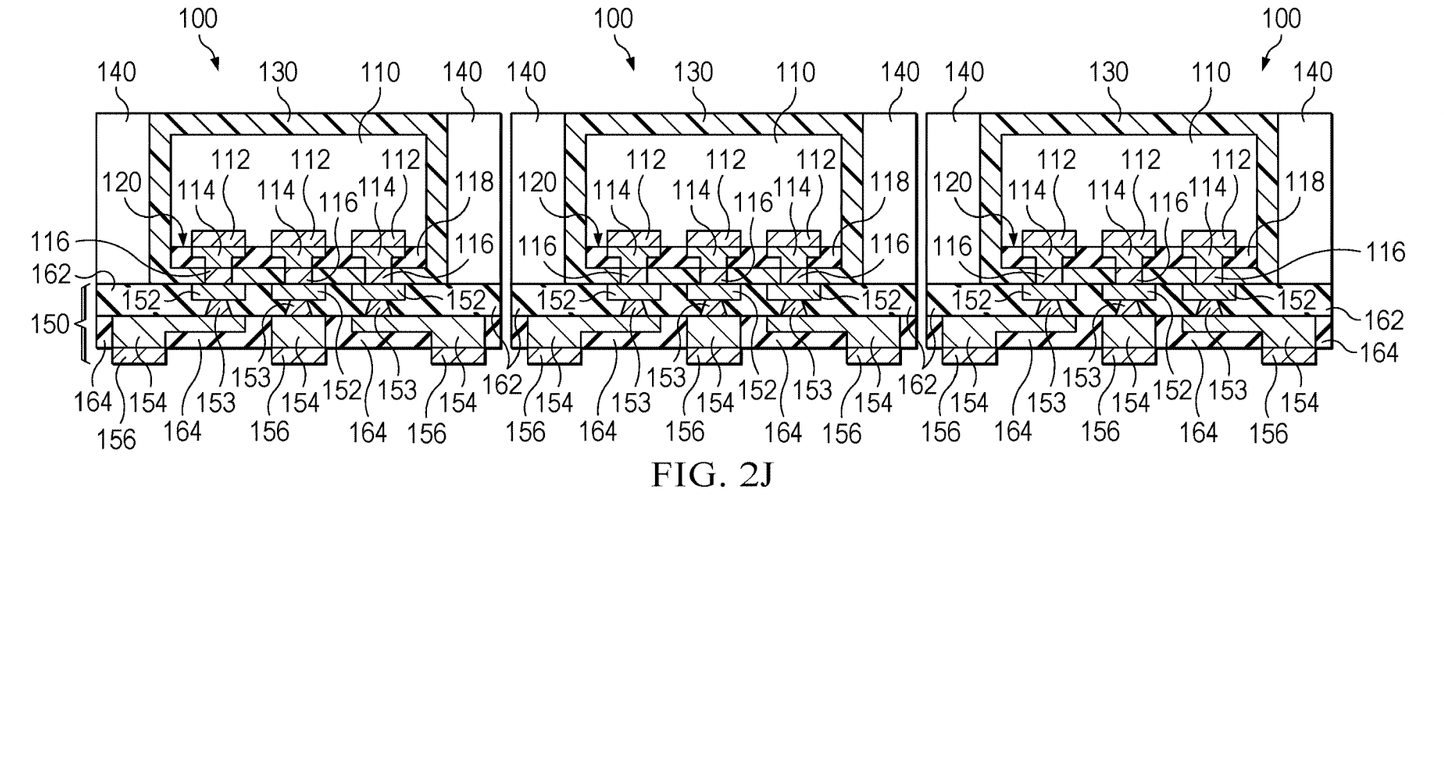

Semiconductor packages 100 are manufactured as an array of packages on a common semiconductor substrate 140. As represented by FIG. 2J, the method further includes singulating the array of molded packages to form individual semiconductor packages 100 (FIG. 3, step 212). Singulation may include cutting through semiconductor substrate 140 and portions of redistribution layer 150 linking the interconnected semiconductor packages 100 with a laser, saw or other cutting implement.

Figure 4:
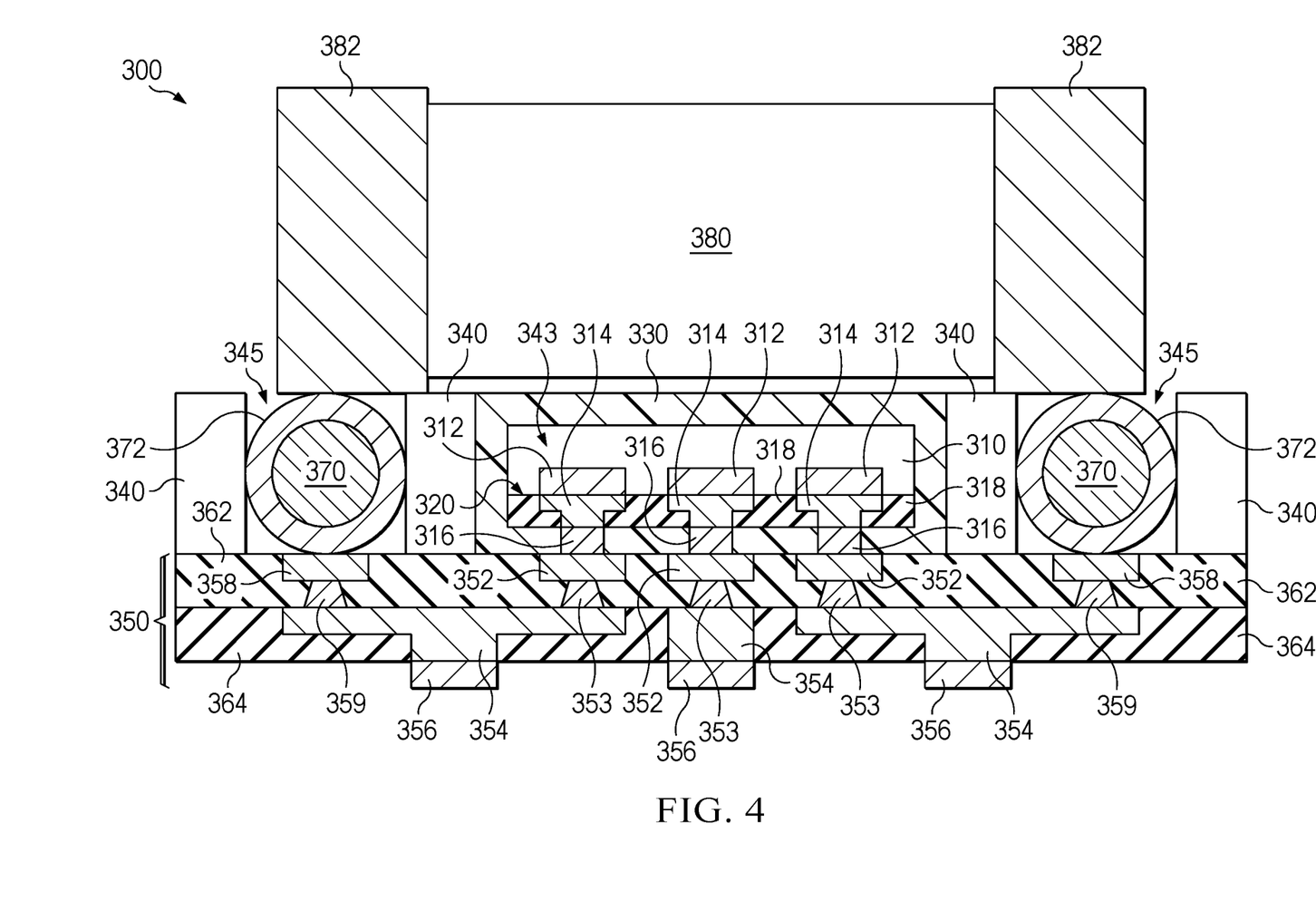
FIG. 4 illustrates a semiconductor package including a semiconductor substrate with an embedded semiconductor die and a stacked passive component.

FIG. 4 illustrates semiconductor package 300. Semiconductor package 300 is substantially similar to semiconductor package 100 with the addition of stacked passive component 380. Elements of semiconductor package 300 with the same last two digits as elements of semiconductor package 100 are the same or substantially similar to those elements in semiconductor package 100. For brevity, such elements are described in limited detail with respect to semiconductor package 300.

Semiconductor package 300 includes a semiconductor substrate 340 forming a cavity 343 with a semiconductor die 310 embedded in cavity 343. As described with respect to semiconductor package 100, semiconductor substrate 340 may be replaced with a glass substrate. Semiconductor package 300 further includes a passive component 380 over an inactive side of semiconductor die 310 on an external surface of package 300. Redistribution layer 350 provides electrical interconnections between package terminals 356, die pads 312, and passive component terminals 382 of passive component 380. Semiconductor package 300 is a fan-out package as package terminals 356 extend beyond the die pad area of die pads 312.

Semiconductor substrate 340 serves as a substrate for the formation of redistribution layer 350. In some examples, semiconductor substrate 340 is formed from a dummy wafer, such as a silicon wafer.

Redistribution layer 350 is on a first side of semiconductor substrate 340. Redistribution layer 350 forms die contacts 352 within cavity 343, passive component contacts 358 within vias 345, and a set of terminals 356 for semiconductor package 300 opposite semiconductor substrate 340. Redistribution layer 350 includes a first dielectric layer 362 over die contacts 352. A redistribution layer trace 354 is over the first dielectric layer 362 with vias 353 that physically and electrically connect to die contacts 352 and vias 359 that physically and electrically connect to passive component contacts 358. A second dielectric layer 364 is over redistribution layer trace 354 with terminals 356 being exposed in gaps in the second dielectric layer 364. The first and second dielectric layers 362, 364 may include dielectrics such as polyimides or BCB. Redistribution layer trace 354 includes individual conductive traces providing electrical interconnections between package terminals 356, die pads 312, and passive component terminals 382. In some examples, package 300 may further include metal bonding connectors, such as solder balls over terminals 356. In such examples, terminals 356 may include UBM pads over a base metal layer of redistribution layer trace 354.

Semiconductor die 310 comprises a substrate (e.g., silicon or silicon/germanium) having an active surface and an inactive surface. Bond pads 312 are exposed in bond pad openings in a dielectric layer of semiconductor die 310 on its active surface. Die pads 312 are bonded to a metallization layer including functional circuitry (not shown) in a semiconductor substrate.

Semiconductor die 310 includes die pads 312 within cavity 343 with an active surface of semiconductor die 310 facing redistribution layer 350. In the specific example of semiconductor package 300, semiconductor die 310 includes a die scale redistribution layer 320 over the die pads 312. Die scale redistribution layer 320 electrically couples die pads 312 to the die contacts 352 within cavity 343. Die scale redistribution layer 320 includes redistribution layer trace 314 with capture pads in contact with die pads 312, and a dielectric layer 318 over redistribution layer trace 314. Dielectric layer 318 may include dielectrics such as polyimides or BCB. In various examples, die scale redistribution layer 320 may include any number of conductive and dielectric layers providing connections between die pads 312 and die contacts 352 of redistribution layer 350. In yet other examples, die pads 312 may directly contact die contacts 352.

Solder connections 316 electrically couple die pads 312 to die contacts 352 within cavity 343. Solder connections 316 are in electrical contact with the redistribution layer trace 314 through openings in the dielectric layer 318. In some examples, solder connections 316 represent reflowed solder bumps. Redistribution layer trace 314 may include UBM pads adjacent to solder connections 316.

Mold compound 330 surrounds semiconductor die 310 within cavity 343. In example of semiconductor package 300, semiconductor die 310 is recessed within cavity 343 such that is it covered by mold compound 330. In other examples, an inactive surface of semiconductor die 310 may be exposed on an external surface of the package, which may facilitate improved cooling of semiconductor die 330.

Passive component 380 with passive component terminals 382 is mounted to semiconductor substrate 340 opposite the redistribution layer 350. In various examples, passive component 380 may include one or more of a resistor, an inductor, and a capacitor. Semiconductor substrate 340 includes vias 345 adjacent passive component 380 contacts. Passive component terminals 382 are electrically connected to passive component contacts 358 by way of vias 345, which include solder connections between passive component 380 contacts and passive component terminals 382. In the example of semiconductor package 300, passive component terminals 382 are electrically connected to passive component contacts 358 with solder balls 372. Solder balls 372 include metal cores 370, such as a copper core. In other examples, metal cores 370 may be omitted or solder balls 372 may be replaced with a solder paste, metal pillars extending through a thickness of semiconductor substrate 340, or by other suitable techniques.

Semiconductor package 300 may be manufactured in a similar manner to semiconductor package 100. For example, vias 345 may be formed in unison with cavity 343 by masking and etching the backside surface of semiconductor substrate 340. Passive component 380 is mounted to the backside of semiconductor substrate 340 after molding mold compound 330 by reflowing solder balls 372, thereby electrically coupling passive component terminals 382 to passive component contacts 358 of the redistribution layer 350 within cavity 343.

The specific techniques for semiconductor packages including a semiconductor substrate with an embedded semiconductor die, including techniques described with respect to packages 100, 300, are merely illustrative of the general inventive concepts included in this disclosure as defined by the following claims.

What is claimed is:

1. A semiconductor package, comprising:
a semiconductor substrate including a cavity;
a redistribution layer on a first side of the semiconductor substrate, the redistribution layer
forming die contacts within the cavity on a first side of the semiconductor substrate and a set of terminals of the semiconductor package on a second side of the semiconductor substrate,
wherein the redistribution layer electrically connects one or more of the die contacts to the set of terminals; and
a semiconductor die including die terminals within the cavity with the die terminals electrically coupled to the die contacts within the cavity.

2. The semiconductor package of claim 1, further comprising a mold compound covering the semiconductor die within the cavity.

3. The semiconductor package of claim 2, wherein the mold compound serves as a underfill between the semiconductor die and the redistribution layer.

4. The semiconductor package of claim 1, wherein the semiconductor die is recessed within the cavity.

5. The semiconductor package of claim 1, further comprising solder connections electrically coupling the die terminals to the die contacts within the cavity.

6. The semiconductor package of claim 1,
wherein the redistribution layer forms passive component contacts on the same side as the die contacts,
wherein the semiconductor substrate includes vias adjacent the passive component contacts,
the package further comprising a passive component with passive component terminals mounted to the semiconductor substrate opposite the redistribution layer,
wherein the passive component terminals are electrically connected to the passive component contacts by way of the vias.

7. The semiconductor package of claim 6, wherein the vias includes solder connections between the passive component contacts of the redistribution layer and the passive component terminals of the passive component.

8. The semiconductor package of claim 6, wherein the redistribution layer electrically connects the passive component contacts to one or more of the die contacts.

9. The semiconductor package of claim 6, wherein the passive component includes one or more of a group consisting of:
a resistor;
an inductor; and
a capacitor.

10. The semiconductor package of claim 1,
wherein the semiconductor substrate is a silicon substrate, and
wherein the semiconductor die is a silicon die.

11. The semiconductor package of claim 1, further comprising a die scale redistribution layer including:
a redistribution layer trace with capture pads in contact with the die terminals;
a dielectric layer over the redistribution layer trace; and
external contact pads in electrical contact with the redistribution layer trace through openings in the dielectric layer.

12. A method of forming a semiconductor package comprising:
forming a redistribution layer on a first side of a semiconductor substrate, the redistribution layer including die contacts adjacent the first side of the semiconductor substrate and a set of terminals of the semiconductor package adjacent a second side of the semiconductor substrate;
forming a cavity in the semiconductor substrate adjacent to the die contacts;
placing a semiconductor die including die terminals within the cavity with the die terminals facing the redistribution layer; and
electrically coupling the die terminals to the die contacts.

13. The method of claim 12, further comprising covering the semiconductor die within the cavity with a mold compound.

14. The method of claim 12, wherein the semiconductor die is positioned fully within the cavity.

15. The method of claim 12, wherein the electrically coupling the die terminals to the die contacts of the redistribution layer within the cavity includes reflowing solder bumps.

16. The method of claim 12, wherein forming the cavity in the semiconductor substrate adjacent to the die contacts includes:
masking a second side of a semiconductor substrate opposite the first side of the semiconductor substrate; and
etching the semiconductor substrate to expose the die contacts.

17. The method of claim 12, wherein the redistribution layer further includes passive component contacts on the same side as the die contacts, the method further comprising:
forming vias adjacent the passive component contacts;
mounting a passive component with passive component terminals to the semiconductor substrate opposite the redistribution layer; and
electrically coupling the passive component terminals to the passive component contacts of the redistribution layer within the cavity.

18. The method of claim 17, wherein the passive component includes one or more of a group consisting of:
a resistor;
an inductor; and
a capacitor.

19. The method of claim 12, wherein the semiconductor substrate is a silicon substrate, and wherein the semiconductor die is a silicon die.

20. The method of claim 12, wherein the semiconductor die includes:
a die scale redistribution layer over the die terminals; and
a dielectric layer over the die scale redistribution layer, wherein the dielectric layer includes die terminal openings through which the die terminals are exposed.

21. The method of claim 12, wherein the placing the semiconductor die includes placing an assembly comprising the semiconductor die and a die scale redistribution layer, the die scale redistribution layer including:
a redistribution layer trace with capture pads in contact with the die terminals;
a dielectric layer over the redistribution layer trace; and
external contact pads in electrical contact with the redistribution layer trace through openings in the dielectric layer.

22. The method of claim 12,
wherein semiconductor substrate is a semiconductor substrate for a plurality of semiconductor packages including the semiconductor package, wherein forming the redistribution layer includes forming the redistribution layer for the plurality of semiconductor packages;

method further comprising:
- forming cavities for each of the plurality of semiconductor packages;
- placing semiconductor dies within the cavities for each of the plurality of semiconductor packages; and
- singulating the plurality of semiconductor packages from semiconductor substrate to form a plurality of singulated semiconductor packages.

23. A semiconductor package, comprising:
a glass substrate forming a cavity;
a redistribution layer on a first side of the glass substrate, the redistribution layer forming die contacts within the cavity and a set of terminals for the semiconductor package opposite the glass substrate,
wherein the redistribution layer electrically connects one or more of the die contacts to the set of terminals; and
a semiconductor die including die terminals within the cavity with the die terminals electrically coupled to the die contacts within the cavity.

24. The semiconductor package of claim 23, wherein the glass substrate includes one or more of a group consisting of:
fused silica;
quartz;
single crystal quartz; borosilicate glass; soda lime glass; barium borosilicate glass; crown glass;
boro-aluminosilicate glass; and
indium tin oxide glass.

* * * * *